(12) United States Patent
Shahbazi et al.

(10) Patent No.: US 9,183,967 B2
(45) Date of Patent: Nov. 10, 2015

(54) LOW FIRING TEMPERATURE COPPER COMPOSITION

(71) Applicant: Heraeus Precious Metals North America Conshohocken LLC, West Conshohocken, PA (US)

(72) Inventors: Samson Shahbazi, Roslyn, PA (US); Mark Challingsworth, Glenside, PA (US); Steve Grabey, Hazleton, PA (US); Ryan Persons, Newtown Square, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 14/022,641

(22) Filed: Sep. 10, 2013

(65) Prior Publication Data

US 2014/0178573 A1  Jun. 26, 2014

Related U.S. Application Data

(60) Provisional application No. 61/699,008, filed on Sep. 10, 2012.

(51) Int. Cl.
  *H01B 1/22* (2006.01)
  *C09D 5/24* (2006.01)
  *H05K 1/09* (2006.01)
  *H05K 3/12* (2006.01)
  *C03C 8/14* (2006.01)

(52) U.S. Cl.
  CPC .. *H01B 1/22* (2013.01); *C03C 8/14* (2013.01); *C09D 5/24* (2013.01); *H05K 1/092* (2013.01); *H05K 3/12* (2013.01); *H05K 3/1291* (2013.01)

(58) Field of Classification Search
  CPC .............. H01B 1/02; H01B 1/16; H01B 1/22; C09D 5/24; H05K 1/0296; H05K 1/092; H01L 23/49883
  See application file for complete search history.

(56) References Cited

U.S. PATENT DOCUMENTS 4,687,597 A * 8/1987 Siuta .............................. 252/512
4,868,034 A * 9/1989 Steinberg ....................... 428/403
5,418,193 A * 5/1995 Tani et al. ........................ 501/19

(Continued)

FOREIGN PATENT DOCUMENTS

| EP | 0 546 560 | 6/1993 |
| EP | 1 583 107 | 10/2005 |
| EP | 2 315 215 | 4/2011 |
| EP | 2 455 947 | 5/2012 |
| JP | 1265405 | * 10/1989 |

(Continued)

*Primary Examiner* — Mark Kopec
(74) *Attorney, Agent, or Firm* — Blank Rome LLP

(57) ABSTRACT

An electroconductive paste comprising first copper particles having a specific surface area of about 0.15-1.0 m$^2$/g, second copper particles having a specific surface area of about 0.5-2.5 m$^2$/g, glass frit and an organic vehicle. According to another embodiment of the invention, the first copper particles are about 60-80 wt. % of the paste, while the content of the second copper particles is up to about 20 wt. % of the paste. According to another embodiment, the glass frit is lead-free and is about 1-10 wt. % of the paste. Preferably, the glass frit comprises a boron-zinc-barium oxide glass frit. According to another embodiment, the paste further comprises copper oxide. Another embodiment of the invention relates to an electroconductive paste comprising about 60-95 wt. % copper component, a boron-zinc-barium oxide glass frit, and an organic vehicle.

22 Claims, 1 Drawing Sheet

(56) References Cited

U.S. PATENT DOCUMENTS 6,174,344 B1 * 1/2001 Hayashi et al. ............ 75/255
2003/0089199 A1 * 5/2003 Sano et al. ............ 75/373
2006/0022173 A1 2/2006 Yamakawa et al.

FOREIGN PATENT DOCUMENTS

| JP | 2003123537 | * | 4/2003 |
| JP | 2004-362862 | | 12/2004 |

* cited by examiner

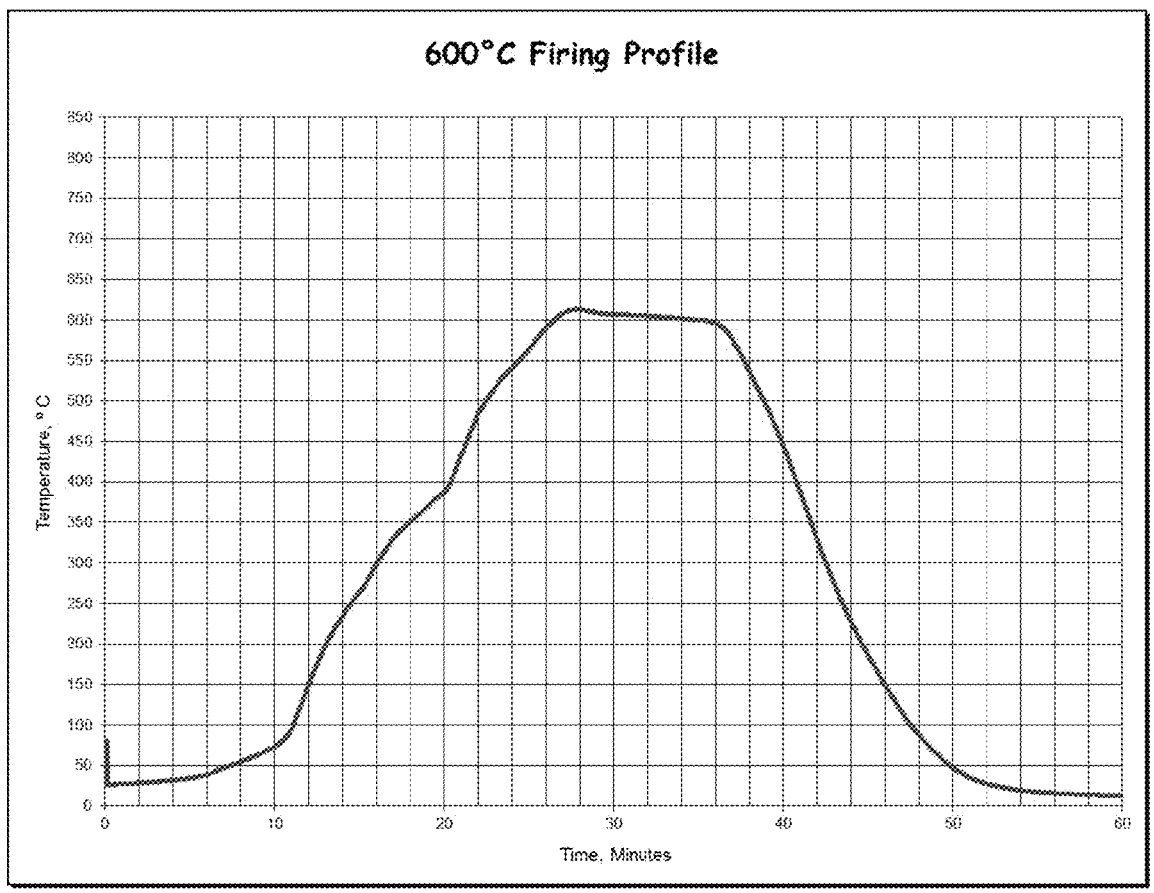

LOW FIRING TEMPERATURE COPPER COMPOSITION

RELATED APPLICATION

This application claims the benefit of U.S. Provisional Application No. 61/699,008, filed Sep. 10, 2012, which is hereby incorporated by reference.

FIELD OF THE INVENTION

The present application relates to a low firing temperature copper conductive paste composition for forming electrically conductive leads on a dielectric layer, particularly for use in LED technology. More specifically, the paste composition can be used in the manufacture of light-emitting diode systems, whereby the paste of the present invention is deposited onto a dielectric layer, which is deposited on a thermally conductive substrate, e.g., aluminum metal or aluminum alloy, to form electrically conductive leads. The present invention also relates to a method of firing a copper paste, dielectric layer and thermal substrate assembly in a nitrogen-rich atmosphere.

BACKGROUND OF THE INVENTION

Light-emitting diodes (LEDs) are semiconductor light sources used in a variety of applications, including general lighting, street lighting, and automotive lighting, to name a few. LEDs emit light through an electroluminescence effect, whereby electrons and holes in a material, typically a semiconductor, recombine, causing the electrons to emit energy in the form of photons, or light. LEDs are advantageous over incandescent light sources because they consume less energy, have a longer lifetime, emit stronger light output, and are smaller in size.

One contributing factor in maintaining the long life of an LED is temperature regulation. High-power LEDs are subjected to higher junction temperatures, sometimes as high as 150° C., which cause stress on the material. Thus, LED performance is temperature-dependent. One way to structure an LED package in order to regulate its temperature is to use a thermal substrate. The majority of high power/high brightness (HP/HB) LED circuits manufactured today are based on Metal Core Printed Circuit Board (MCPCB) technology. The MCPCB system consists of a copper foil, which acts as the circuit layer, a polymer dielectric layer, and either an aluminum or copper base layer that acts as the thermal substrate. The aluminum or copper substrate has excellent thermal conductivity and provides for thermal dissipation away from the circuitry. The polymer dielectric layer electrically insulates the copper foil from the thermal substrate, while also having good thermal conductivity to allow the heat to be transferred to the thermal substrate.

The MCPCB system is typically manufactured using a subtractive process, whereby the copper foil, dielectric layer and thermal substrate are laminated together, and the copper foil is then chemically etched to create the desired electrical pattern to form the circuit layer. This process can be costly, as it is labor intensive and there is a significant amount of material waste through the copper etching process.

Therefore, an electroconductive component is needed that is simple to manufacture, has optimal heat dissipation properties, and reduces the amount of material waste resulting from the formation of the electrical leads. It preferably also results in the formation of dense fired leads that are highly conductive. The material used for the circuitry preferably is able to be processed at temperatures less than about 610° C., as aluminum substrates begin to distort at temperatures above 620° C. Further, the circuitry should adhere well to the dielectric layer. Lastly, the ideal LED system preferably performs well under a variety of environmental conditions, including automotive and outdoor uses.

SUMMARY OF THE INVENTION

The invention relates to an electroconductive paste comprising a copper component, a glass frit, and an organic vehicle. According to one embodiment, the copper component comprises two types of copper particles having different surface areas. Preferably, the copper component comprises first copper particles having a specific surface area of about 0.15-1.0 $m^2/g$ and second copper particles having a specific surface area of about 0.5-2.5 $m^2/g$. More preferably, the first copper particles have a specific surface area of about 0.15-0.5 $m^2/g$, and even more preferably about 0.15-0.35 $m^2/g$. According to another preferred embodiment, the second copper particles have a specific surface area of about 0.5-1.5 $m^2/g$, more preferably about 0.9-1.3 $m^2/g$.

According to one embodiment, the first copper particles have an average particle size of less than 2 microns and the second copper particles have an average particle size of about 2.5-4.7 microns. According to one embodiment, the first copper particles are about 60-80 wt. % of the paste and the second copper particles are up to about 20 wt. % of the paste. According to a preferred embodiment, the first copper particles are about 70 wt. % of the paste and the second copper particles are about 10 wt. % of the paste.

According to another embodiment of the invention, the glass frit comprises oxides which are substantially lead-free. According to one embodiment, the glass frit comprises boron-zinc-barium oxide. The glass frit may be about 1-10 wt. % of the paste.

The organic vehicle may comprise a binder and an organic solvent. According to one embodiment, the organic vehicle comprises an acrylic binder and texanol. The organic vehicle may be about 10-30 wt. % of the paste.

According to another embodiment of the invention, the paste further comprises copper oxide. The copper oxide may be about 0.5-3 wt. % of the paste.

The invention also relates to an electroconductive paste comprising about 60-95% wt. copper particles, glass frit comprising boron-zinc-barium oxide, and an organic vehicle. According to one embodiment, the glass frit is about 1-5 wt. % of the paste. The organic vehicle may comprise a binder and an organic solvent. According to one embodiment, the organic vehicle comprises an acrylic binder and texanol. The organic vehicle may be about 1-20 wt. % of the paste. In another embodiment, the paste further comprises copper oxide. The copper oxide may be about 0.5-3 wt. % of the paste.

The invention also relates to a method of forming an electroconductive circuit, comprising the steps of depositing an electroconductive paste to form a pattern for a conductive lead, wherein the electroconductive paste comprises a copper component comprising first copper particles having a specific surface area of 0.15-1.0 $m^2/g$, and second copper particles having a specific surface area of 0.5-2.5 $m^2/g$ (such as those described above), as well as a glass frit and an organic vehicle. The conductive lead is then fired, for example, by subjecting it to a peak temperature of about 540-610° C., preferably in a nitrogen atmosphere. The nitrogen atmosphere may comprise oxygen, e.g., about 0.5-20 ppm oxygen. In one embodiment, the temperature is held at the peak temperature for about 8-10 minutes.

According to one embodiment, the nitrogen atmosphere comprises about 1-10 ppm oxygen. In another embodiment, the nitrogen atmosphere comprises about 2-3 ppm oxygen.

According to one embodiment, the conductive lead is heated from room temperature to a peak temperature of about 540-610° C. over about 25-28 minutes, held at the peak temperature for 8-10 minutes, and cooled to room temperature over about 14-16 minutes.

According to another embodiment, the first copper particles have a specific surface area of about 0.15-0.5 $m^2/g$, preferably about 0.15-0.35 $m^2/g$. In another embodiment, the second copper particles have a specific surface area of about 0.5-1.5 $m^2/g$, preferably about 0.9-1.3 $m^2/g$. In another embodiment, the first copper particles have an average particle size of less than 2 microns. In yet another embodiment, the second copper particles have an average particle size of about 2.5-4.7 microns. According to another embodiment, the first copper particles are about 60-80 wt. % of the paste, preferably about 70 wt. % of the paste. In another embodiment, the second copper particles are up to about 20 wt. % of the paste, preferably about 10 wt. % of the paste.

According to another embodiment, the glass frit comprises oxides which are substantially lead-free. In another embodiment, the glass frit comprises boron-zinc-barium oxide. In one embodiment, the glass frit is about 1-10 wt. % of the paste.

The organic vehicle may comprise a binder and an organic solvent. In one embodiment, the organic vehicle comprises an acrylic binder and texanol. In another embodiment, the organic vehicle is about 10-30 wt. % of the paste.

According to another embodiment, the paste further comprises copper oxide. In one embodiment, the copper oxide is about 0.5-3 wt. % of the paste.

Other objects, advantages and salient features of the invention will become apparent from the following detailed description, which, taken in conjunction with the annexed drawings, discloses a preferred embodiment of the invention.

BRIEF DESCRIPTION OF THE DRAWINGS

FIG. 1 is a graph of a firing profile depicting temperature as a function of time according to an exemplary embodiment of the invention.

DETAILED DESCRIPTION OF THE EXEMPLARY EMBODIMENTS

The invention is directed to a low firing temperature copper electroconductive paste composition. While not limited to such an application, such a paste may be used to form electrically conductive leads in an LED assembly. A desired paste for this application has optimal electrical properties and adheres well to the underlying substrate (the dielectric layer). Typically, the electroconductive paste composition comprises a conductive component, a glass frit and an organic vehicle. In addition, the electroconductive paste composition may also comprise an oxide additive.

According to one embodiment, the invention provides a low firing temperature copper electroconductive paste comprising a copper component, a glass frit and an organic vehicle. The electroconductive paste may also comprise a copper oxide additive.

Copper Component

The copper component of the invention provides the conductivity for the electroconductive paste. According to one embodiment, the copper component comprises two elemental copper particles having different surface areas. The use of two copper particles with different surface areas, as opposed to the use of only one type of copper particle, improves the density of the fired conductive leads, which in turn improves conductivity. If the leads are not sufficiently dense, such that they have gaps in their microstructure, the flow of electricity through the lead will be impeded.

Preferably, the copper component comprises first copper particles having a specific surface area of about 0.15-1.0 $m^2/g$, and second copper particles having a specific surface area of about 0.5-2.5 $m^2/g$. More preferably, the first copper particles have a specific surface area of about 0.15-0.5 $m^2/g$, and the second copper particles have a specific surface area of about 0.5-1.5 $m^2/g$. Most preferably, the first copper particles have a specific surface area of about 0.15-0.35 $m^2/g$, and the second copper particles have a specific surface area of about 0.9-1.3 $m^2/g$. According to one embodiment, the difference between the specific surface area of the first copper particles and the second copper particles may be at least 0.4 $m^2/g$ (e.g., at least 0.5, 0.6, 0.7 or 0.8 $m^2$ g). Methods of measuring specific surface area are known in the art. As set forth herein, all surface area measurements were performed using the BET (Brunauer-Emmett-Teller) method via a Monosorb MS-22 analyzer (manufactured by Quantachrome Instruments of Boynton Beach, Fla.).

Another method of characterizing the copper particles is by their particle size distribution ($D_{50}$). $D_{50}$ is the median diameter or the medium value of the particle size distribution. It is the value of the particle diameter at 50% in the cumulative distribution. According to one embodiment, the first copper particles may have an average particle size (D50) of less than 2 microns and the second copper particles may have an average particle size (D50) of about 2.5-4.7 microns. Particle size distribution may be measured via laser diffraction, dynamic light scattering, imaging, electrophoretic light scattering, or any other method known in the art. All particle size measurements described herein ($D_{50}$) were performed using an X-ray/sedimentation method via a SediGraph III Particle Size Analyzer (manufactured by Micromeritics Instrument Corp. of Norcross, Ga.).

Preferably, the paste comprises approximately 60-80 wt. % of the first copper particles and second copper particles in an amount of up to about 20 wt. %, based upon the total weight of the paste. In one preferred embodiment, the paste comprises about 70 wt. % of the first copper particles and about 10 wt. % of the second copper particles. According to one embodiment of the invention, the low firing temperature copper electroconductive paste comprises a copper component at about 60-95 wt. % of the paste, a glass frit, and an organic vehicle.

Glass Frit

The glass frit contributes to the electroconductive paste's ability to adhere well to the underlying substrate. According to one embodiment, the glass frit is about 1-10 wt. % of the paste and is preferably lead-free, i.e., without any intentionally added lead or lead compound and having no more than trace amounts of lead. Preferably, the glass frit is about 1-5 wt. % of the paste.

The glass frit may be substantially amorphous, or it may incorporate partially crystalline phases or compounds. Lead-free glass frits may include a variety of oxides or compounds known to one skilled in the art. For example, silicon, boron, aluminum, bismuth, zinc, titanium, barium or chromium oxides or compounds may be used. Other glass matrix formers or glass modifiers, such as germanium oxide, vanadium oxide, tungsten oxide, molybdenum oxides, niobium oxide, tin oxide, indium oxide, other alkaline and alkaline earth metal (such as K, Rb, Cs and Be, Ca, Sr, and Ba) compounds, rare earth oxides (such as $La_2O_3$ and cerium oxides) may also be part of the glass composition.

According to a preferred embodiment, a boron-barium-zinc oxide glass is used. As set forth more fully herein, the boron-barium-zinc oxide glass frit was found to have optimal adhesive properties, preferably having the following molar ratios: about 30-60 mol % $B_2O_3$; about 20-40 mol % BaO; and about 10-40 mol % ZnO. The oxides may be combined in their respective oxide forms, or any boron, barium or zinc compounds known to one skilled in the art (e.g., $B_2O_3$, $B_2O$, $H_3BO_3$, BaO, $Ba(OH)_2$, ZnO, and $Zn(OH)_2$), that would produce the referenced oxides at firing temperature may be used.

The $B_2O_3$—BaO—ZnO glass frits described herein can be made by any process known to one skilled in the art, including, but not limited to, mixing appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture may then be heated to around 800-1200° C. (depending on the materials) for about 30-40 minutes. The glass may then be quenched, taking on a sand-like consistency. This coarse glass powder may then be milled, such as in a ball mill or jet mill, until a fine powder results. Typically, the glass frit powder is milled to an average particle size of 0.01-10 μm, preferably 0.1-5 μm.

Organic Vehicle

Preferred organic vehicles in the context of the invention are solutions, emulsions or dispersions based on one or more solvents, preferably an organic solvent, which ensure that the constituents of the electroconductive paste are present in a dissolved, emulsified or dispersed form. According to one embodiment, the organic vehicle may be about 10-30 wt. % of the paste. According to another embodiment, the organic vehicle may be about 1-20 wt. % of the paste.

In one embodiment, the organic vehicle may comprise a binder and a solvent. Suitable binders include, but are not limited to, cellulose, phenolic, or acrylic resins. Suitable solvents, include, but are not limited to, carbitol, terpineol, hexyl carbitol, texanol, butyl carbitol, butyl carbitol acetate, or dimethyladipate or glycol ethers. In a preferred embodiment, the organic vehicle is comprised of a binder and solvent that have low burnout temperatures (approximately 350° C. or lower) in a low oxygen content environment (<10 ppm $O_2$), in order to reduce the presence of char residue. Specifically, an acrylic resin and a texanol solvent have optimal clean burning during firing of the paste. Organic vehicles may also include surfactants and thixatropic agents known in the art. Suitable surfactants include, but are not limited to, polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof.

Oxide Additive

The conductive paste composition may also comprise an oxide additive to aid in adhesion. The oxide additive is preferably present in the form of a powder. The oxide powder may be about 0.5-3 wt. % of the paste. Preferably, the oxide powder is a copper oxide of any form, including, but not limited to, CuO and $Cu_2O$. According to one embodiment, the copper oxide may be present in the paste as a distinct and separate component apart from the glass frit.

Preparing the Electroconductive Paste

The electroconductive paste composition may be prepared by any method for preparing a paste composition known in the art. The method of preparation is not critical, as long as it results in a homogeneously dispersed paste. As an example, without limitation, the paste components may then be mixed, such as with a mixer, then passed through a three roll mill to make a dispersed uniform paste. The paste can then be deposited, e.g., screen printed, onto a substrate to form electrically conductive leads.

Forming an LED Assembly

In an exemplary application, the copper paste composition can be used to form an LED assembly on a metal substrate. To manufacture an LED assembly, one or more layers of a dielectric glass material are screen printed onto an underlying substrate, preferably aluminum or aluminum alloy, due to its optimal thermal conductivity. The dielectric material preferably has optimal thermal conductivity, while providing electrical insulation (preferably having a high breakdown voltage). Additionally, the dielectric material preferably has a thermal coefficient of expansion similar to that of the thermally conductive substrate, to prevent bowing or warping during the firing process. Lastly, when using an aluminum substrate, the dielectric material is preferably sintered at a temperature below 610° C., as aluminum melts above this temperature. As an example, without limitation, the Celcion™ IP6075 dielectric paste sold by Heraeus Precious Metals North America Conshohocken LLC meets all of these requirements.

In one embodiment, the substrate, with the dielectric layers, is first fired in air at about 550° C. After firing, the final thickness of the dielectric layers may be approximately 40-60 microns. The copper conductive paste is then screen printed onto the surface of the top dielectric layer, for example, using a 280 mesh, 0.5 mil emulsion stainless steel screen, and preferably has a wet thickness of 38-42 microns. The printed pattern is specific to the type of LED application, and is not limited to any specific configuration. The copper conductive paste is dried at 125° C. for ten minutes, and the complete assembly is then fired according to a set firing profile.

According to another embodiment, the assembly is fired in a nitrogen atmosphere according to a specific profile. If a copper conductive paste is fired in an environment too rich in oxygen, the copper component may begin to oxidize. However, a minimum level of oxygen is preferable to facilitate burnout of the organic binder in the paste. According to a preferred embodiment of the invention, approximately 0.5-20 ppm of oxygen is present in the furnace atmosphere. More preferably, approximately 1-10 ppm of oxygen is present in the furnace atmosphere, and most preferably, approximately 2-3 ppm of oxygen is present. The firing may be performed at a peak temperature of about 540-610° C., with a variance of 10° C., with the assembly preferably held for 8-10 minutes at peak temperature. FIG. 1 depicts an appropriate firing profile.

To form a completed LED assembly, one or more light emitting diodes are soldered to the electroconductive leads or soldering pads formed from the copper paste. Any soldering method known in the art may be used.

EXAMPLES

Example 1

Combinations of two copper powders were tested to ascertain the effect of surface area on conductive performance and adhesion at a 600° C. firing profile. Exemplary paste formulations having varying amounts of two copper powders were prepared. High surface area (SA) copper powder having a surface area of about 1.2 m²/g, and low surface area (SA) copper powder having a surface area of about 0.34 m²/g, were used. The exemplary pastes also comprised 3 wt. % of a $B_2O_3$—BaO—ZnO glass frit, as well as an organic vehicle and 3 wt. % of a copper oxide additive (apart from the glass frit).

The exemplary pastes were then printed onto dielectric coated aluminum substrates and evaluated for adhesive strength and solder acceptance using a soldered wire pull test as described herein. Average adhesion, or "pull force," is considered satisfactory in the industry when equal to or greater than about 4 lbf. A solder acceptance of >95% is considered satisfactory in the industry. The sheet resistance, or the resistance measured across the plane of each printed paste, was also measured to measure the conductivity. Generally, the higher the sheet resistance, the lower the conductivity. The dielectric material used to coat the aluminum substrates was Celcion™ IP6075 dielectric glass paste sold by Heraeus Precious Metals North America Conshohocken LLC. The exemplary paste compositions and test results are set forth in Table 1.

temperature. Example Paste 1 contained no high surface area copper powder, while Example Paste 2 contained about 10 wt. % high surface area copper powder and about 71 wt. % low surface area copper powder. While Example Paste 2 exhibited satisfactory adhesion, it also had lower sheet resistance than Example Paste 1, thus exhibiting better electrical performance.

Example 2

Example pastes having various types and amounts of glass frits and varying amounts of a CuO or $Cu_2O$ additive were also prepared to ascertain the effect that the glass frit and additive have on the adhesive performance of the electroconductive paste. The compositions and amounts of these components are set forth in Table 2 below. Each exemplary paste comprises two types of copper particles, one having a lower surface area of about 0.15-0.5 m²/g, and the other having a higher surface area of about 1.0-1.4 m²/g. Each paste comprises about 71 wt. % of the lower surface area copper powder and 10 wt. % of the higher surface area copper powder, based upon 100% total weight of the paste.

As in Example 1, these pastes were also evaluated using a soldered wire pull test to ascertain the effect on adhesion and

TABLE 1

Electrical and Adhesive Performance of Exemplary Pastes having High and Low Surface Area Copper Powder

| Example Paste | High SA Cu Powder (%) | Low SA Cu Powder (%) | Glass Frit | Oxide | Average Adhesion (lbf) | Solder Acceptance | Sheet Resistance (mΩ/sq/mil) |
|---|---|---|---|---|---|---|---|
| 1 | 0 | 81 | $B_2O_3$—ZnO—BaO | CuO | 4.57 | >95% | 5.34 |
| 2 | 10 | 71 | $B_2O_3$—ZnO—BaO | CuO | 4.24 | >95% | 3.81 |
| 3 | 24.3 | 56.6 | $B_2O_3$—ZnO—BaO | CuO | 0 | 95% | 4.02 |
| 4 | 40.5 | 40.5 | $B_2O_3$—ZnO—BaO | CuO | 0 | <50% | 8.5 |
| 5 | 56.6 | 24.3 | $B_2O_3$—ZnO—BaO | CuO | 0 | <50% | 15.33 |
| 6 | 81 | 0 | $B_2O_3$—ZnO—BaO | CuO | 0 | <50% | 23.45 |

In the specific example shown here, without limitation, Examples Pastes 1 and 2 resulted in satisfactory adhesion (above 4 lbf) and solder acceptance (>95%) at 600° C. firing solder acceptance. Adhesion after thermal cycling was also tested, as described more fully herein. The results are set forth in Table 2 below.

TABLE 2

Glass Frit and Oxide Composition - Effect on Adhesion

| Example Paste | Glass Frit | Oxide | Avg. Adhesion (lbf) | Solder Acceptance | 250 Hr 150° C. Adhesion |
|---|---|---|---|---|---|
| 1 | $B_2O_3$—$Bi_2O_3$ (5 wt. %) | CuO (0.75 wt. %) | 1.18 | <50% | — |
| 2 | $B_2O_3$—ZnO—BaO (5 wt. %) | CuO (0.75 wt. %) | 5.08 | <50% | — |
| 3 | $B_2O_3$—ZnO—BaO (3 wt. %) | CuO (0.75 wt. %) | 4.86 | <95% | 4.1 |
| 4 | $B_2O_3$—$Bi_2O_3$ (2 wt. %) + $B_2O_3$—ZnO—BaO (3 wt. %) | CuO (0.75 wt. %) | 1.11 | <50% | — |
| 5 | $B_2O_3$—ZnO—BaO (3 wt. %) | CuO (3.0 wt. %) | 4.29-4.85 | <95% | 4.6-5.4 |
| 6 | $B_2O_3$—ZnO—BaO (3 wt. %) | CuO (5.0 wt. %) | 4.58 | 80-90% | — |
| 7 | $B_2O_3$—ZnO—BaO (3 wt. %) | $Cu_2O$ (3.0 wt. %) | 3.95 | 80-90% | — |
| 8 | $B_2O_3$—ZnO—BaO (3 wt. %) | $Cu_2O$ (3.0 wt. %) | 4.55 | <95% | 3.98 |
| 9 | $B_2O_3$—ZnO—BaO (1.5 wt. %) | CuO (1.5 wt. %) | — | — | — |

TABLE 2-continued

Glass Frit and Oxide Composition - Effect on Adhesion

| Example Paste | Glass Frit | Oxide | Avg. Adhesion (lbf) | Solder Acceptance | 250 Hr 150° C. Adhesion |
|---|---|---|---|---|---|
| 10 | $Bi_2O_3$—ZnO—$B_2O_3$ (5 wt. %) | CuO (0.75 wt. %) | 1.43 | <50% | — |
| 11 | $B_2O_3$—$SiO_2$—$Bi_2O_3$—$TiO_2$ (5 wt. %) | CuO (0.75 wt. %) | 1.72 | <50% | — |
| 12 | $B_2O_3$—$SiO_2$—ZnO—$Bi_2O_3$—$TiO_2$ (5 wt. %) | CuO (0.75 wt. %) | 1.32 | <50% | — |
| 13 | $B_2O_3$—$SiO_2$—$Bi_2O_3$—$Al_2O_3$—$Cr_2O_3$—ZnO (5 wt. %) | CuO (0.75 wt. %) | 1.1 | <50% | — |

Exemplary Paste 5, as outlined in Table 2, exhibited optimal average adhesion and adhesion after thermal cycling. Thus, Paste 5 was used to test the solder acceptance and leach resistance of the fired copper film using a tin-copper-silver (SAC 305) solder, as well as the adhesion with the underlying substrate and dielectric film. All solder performance testing was conducted using the Robotic Process Systems Automatic Solderability Tester Model 202TL. The testing parameters of this model are set forth in Table 3 below. The test coupon was first clamped into a substrate holder. The coupon was then dipped in flux (which prevents oxidation at the solder joint) for a prescribed amount of time at a set depth with a five-second delay between flux dipping and immersion in the molten solder alloy. The test coupon was then immersed in the molten solder alloy at a prescribed depth and for a time depending on the test being conducted. After the elapsed dwell time, the coupon was raised from the molten solder alloy, allowed to cool, and then cleaned with acetone.

TABLE 3

Robotic Process Systems Automatic Solderability Tester - Testing Parameters

| | |
|---|---|
| Flux Dwell | 5 seconds |
| Flux Hold | 1 second |
| Flux In | 1 second |
| Flux Out | 1 second |
| Solder Dwell | 5 seconds (solder acceptance and adhesion testing) 10 seconds (leach resistance testing) |
| Solder In | 1 second |
| Solder Out | 1 second |

Solder acceptance was determined by visual inspection under a microscope at 50× magnification. Leach resistance was calculated by dividing the post-soldered area by the pre-soldered area, the pad dimensions having been measured prior to and after dipping during the soldering process. The results are listed in Tables 4 and 5 below. As it can be seen, the solder acceptance was above 95%. The leach resistance was low, exhibiting less than 5% leach resistance after the first two dips, and less than 10% leach resistance after a third dip. Leach resistance of less than 10% area loss, after three 5-second dips, using tin-copper-silver solder alloy (lead free) is considered satisfactory in the industry.

TABLE 4

Solder Acceptance of Exemplary Copper Paste

| Solder Acceptance Test | Solder Acceptance Result |
|---|---|
| Solderability | >95% solder coverage after 1 × 5 sec. dip in solder bath |

TABLE 5

Solder Leach Resistance of Exemplary Copper Paste

| Solder Leach Resistance Test Condition | Solder Leach Resistance Result |
|---|---|
| 1 × 5 sec dip in SAC305 solder | <5% loss of copper conductor area |
| 2 × 5 sec dip in SAC305 solder | <5% loss of copper conductor area |
| 3 × 5 sec dip in SAC305 solder | <10% loss of copper conductor area |

To determine adhesion, a soldered wire pull test was performed. In this particular test, leads were positioned over 80×80 mil conductor pads which were deposited on the test coupon. The test coupons were placed in a fixture to hold the leads in place, and then inserted into the testing arm of the solder dipper. The test coupons were immersed in the flux according to the parameters set forth in Table 3, and then cleaned with acetone and allowed to air dry for a minimum of six hours. The hooks were cut off and the wires bent to a 90° angle using a mechanical fixture to minimize any variation in bend angle. Initial adhesion was determined after the coupon air dried for a minimum of six hours. The remaining coupons were divided into three groups and each was treated according to one of the following temperature profiles: (1) heated in a 150° C. box oven for 1,000 hours; (2) heated in a 85° C. box oven with 85% relative humidity for 1,000 hours; or (3) subjected to thermal cycling at 31 55° C./+150° C. for 1,000 cycles. Those coupons subjected to thermal cycling (subset 3) were allowed to come to room temperature and equilibrate before testing adhesion.

Lead pull testing was used to determine the force needed to pull the individual leads from the printed conductor pad after soldering. Each lead was trimmed to two inches (flat), and the parts were then clamped into the grip of a Zwick Z2.5 Pull Tester. Each lead was pulled perpendicular to the substrate until it separated from the printed conductor pad. The arm movement was set at a constant speed of 0.5 inches/minute. The grip separation was set at 1.25 inches. The pull testing results for the coupons heated to 150° C. at set time increments is set forth in Table 6 below. The pull testing results for the coupons heated to 85° C. with 85% relative humidity at set time increments is set forth in Table 7 below. The pull testing results for the coupons subject to thermal cycling at −55° C./+150° C. is set forth in Table 8 below. The failure mode of each test is also set forth in Tables 6-8. Above the threshold pull force, three types of failures modes may occur. The wire can pull from the soldered pad (WP), the dielectric layer can experience failure (DF), or the copper conductor pad itself can detach from the dielectric (PF).

TABLE 6

Adhesion between Conductive Paste and Solder: 150° C. Aging

| Time | Adhesion (lbs) | Failure Mode |
|---|---|---|
| 0 hours (no heating) | 4.3 | WP |
| 48 hours | 5.7 | WP/DF |
| 96 hours | 5.0 | DF |
| 144 hours | 5.0 | DF |
| 250 hours | 5.4 | DF |
| 500 hours | 4.4 | DF |
| 1,000 hours | 3.0 | DF |

TABLE 7

Adhesion between Conductive Paste and Solder: 85° C./85% RH

| Time | Adhesion (lbs) | Failure Mode |
|---|---|---|
| 0 hours (no heating) | 4.8 | WP |
| 48 hours | 5.3 | WP/DF |
| 96 hours | 3.5 | WP/DF |
| 144 hours | 4.9 | DF |
| 250 hours | 5.6 | DF |
| 500 hours | 6.0 | DF |
| 1,000 hours | 4.7 | DF |

TABLE 8

Adhesion between Conductive Paste and Solder: −55° C./+150° C. Thermal Cycling

| Cycles | Adhesion (lbs) | Failure Mode |
|---|---|---|
| 50 | 5.66 | WP/DF |
| 100 | 3.92 | DF |
| 200 | 4.50 | DF |
| 300 | 4.89 | DF |
| 400 | 4.52 | DF |
| 500 | 3.98 | WP/DF |
| 600 | 2.53 | WP/DF |
| 700 | 3.99 | WP/DF |
| 800 | 4.89 | WP/DF |
| 900 | 4.44 | WP/DF |
| 1,000 | 2.85 | WP/DF |

As Tables 6-8 show, in none of the tests did the copper pad detach from the underlying dielectric substrate. All tests exhibited satisfactory adhesion levels, and failure modes were limited to failure of the underlying dielectric, the wire pulling from the lead, or a combination of both. The copper conductive pads did not fail and showed excellent adhesion to the dielectric layers.

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed is:

1. An electroconductive paste comprising:
a copper component comprising first copper particles having a specific surface area of about 0.15-1.0 m²/g, and up to about 20 wt % second copper particles having a specific surface area of about 0.5-2.5 m²/g, based upon 100% total weight of the paste, wherein the specific surface area of the first copper particles is different from the specific surface area of the second copper particles;
glass frit; and
organic vehicle.

2. The electroconductive paste of claim 1, wherein the first copper particles have a specific surface area of about 0.15-0.5 m²/g.

3. The electroconductive paste of claim 1, wherein the second copper particles have a specific surface area of about 0.5-1.5 m²/g.

4. The electroconductive paste of claim 1, wherein the difference between the specific surface area of the first copper particles and the specific surface area of the second copper particles is at least 0.4 m²/g.

5. The electroconductive paste of claim 1, wherein the first copper particles have an average particle size of less than 2 microns.

6. The electroconductive paste of claim 1, wherein the second copper particles have an average particle size of about 2.5-4.7 microns.

7. The electroconductive paste of claim 1, wherein the first copper particles are about 60-80 wt. % of the paste.

8. The electroconductive paste of claim 1, wherein the glass frit comprises oxides which are substantially lead-free.

9. The electroconductive paste of claim 1, wherein the glass frit comprises boron-zinc-barium oxide.

10. The electroconductive paste of claim 1, wherein the glass frit is about 1-10 wt. % of the paste.

11. The electroconductive paste of claim 1, wherein the organic vehicle comprises a binder and an organic solvent.

12. The electroconductive paste of claim 1, wherein the organic vehicle comprises an acrylic binder and texanol.

13. The electroconductive paste of claim 1, wherein the organic vehicle is about 10-30 wt. % of the paste.

14. The electroconductive paste of claim 1, further comprising copper oxide.

15. The electroconductive paste of claim 14, wherein the copper oxide is about 0.5-3 wt. % of the paste.

16. An electroconductive paste comprising:
60-95 wt. % of a copper component particles comprising first copper particles having a specific surface area of about 0.15-1.0 m²/g and second copper particles having a specific surface area of about 0.5-2.5 m²/g, wherein the difference between the specific surface area of the first copper particles and the specific surface area of the second copper particles is at least 0.4 m²/g;
glass frit comprising boron-zinc-barium oxide; and
organic vehicle.

17. The electroconductive paste of claim 16, wherein the glass frit is about 1-5 wt. % of the paste.

18. The electroconductive paste of claim 16, wherein the organic vehicle comprises a binder and an organic solvent.

19. The electroconductive paste of claim 16, wherein the organic vehicle comprises an acrylic binder and texanol.

20. The electroconductive paste of claim 16, wherein the organic vehicle is about 1-20 wt. % of the paste.

21. The electroconductive paste of claim 16, further comprising copper oxide.

22. The electroconductive paste of claim 21, wherein the copper oxide is about 0.5-3 wt. % of the paste.

\* \* \* \* \*